US009515469B2

(12) United States Patent
Laskaris et al.

(10) Patent No.: US 9,515,469 B2
(45) Date of Patent: Dec. 6, 2016

(54) VACUUM FEED-THROUGH ASSEMBLY

(71) Applicant: GENERAL ELECTRIC COMPANY, Schenectady, NY (US)

(72) Inventors: Evangelos Trifon Laskaris, Schenectady, NY (US); Gene Conte, Schenectady, NY (US); Susumu Mine, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 1027 days.

(21) Appl. No.: 13/714,651

(22) Filed: Dec. 14, 2012

(65) Prior Publication Data

US 2014/0167757 A1 Jun. 19, 2014

(51) Int. Cl.
| | |
|---|---|
| *G01V 3/00* | (2006.01) |
| *H02G 3/22* | (2006.01) |
| *G01R 33/30* | (2006.01) |
| *H01F 6/06* | (2006.01) |
| *G01R 33/3815* | (2006.01) |

(52) U.S. Cl.
CPC .............. *H02G 3/22* (2013.01); *G01R 33/305* (2013.01); *H01F 6/065* (2013.01); *G01R 33/3815* (2013.01); *Y10T 29/49885* (2015.01)

(58) Field of Classification Search
CPC .................................................. G01R 33/305
USPC ........................................ 324/321, 318, 322
See application file for complete search history.

(56) References Cited

U.S. PATENT DOCUMENTS

| | | | |
|---|---|---|---|
| 3,904,815 A | | 9/1975 | Bamberger et al. |
| 3,928,903 A | * | 12/1975 | Richardson et al. ........ 29/407.1 |
| 4,174,145 A | | 11/1979 | Oeschger et al. |
| 4,316,304 A | | 2/1982 | Parise et al. |
| 4,427,842 A | * | 1/1984 | Anderson ................... 174/77 R |
| 4,484,019 A | | 11/1984 | Grotz |
| 4,709,831 A | * | 12/1987 | Coplan .......................... 220/304 |
| 4,986,078 A | * | 1/1991 | Laskaris ......................... 62/51.1 |
| 5,227,587 A | * | 7/1993 | Paterek ................. 174/152 GM |
| 5,348,497 A | * | 9/1994 | Nitescu .......................... 439/824 |
| 6,300,572 B1 | | 10/2001 | McKay |
| 6,339,195 B1 | | 1/2002 | Wilson et al. |
| 6,453,551 B1 | | 9/2002 | Nordquist et al. |
| 7,326,015 B2 | * | 2/2008 | Reynolds, Jr. ................ 411/424 |
| 2001/0019755 A1 | | 9/2001 | Granoff et al. |

(Continued)

FOREIGN PATENT DOCUMENTS

| | | |
|---|---|---|
| CN | 1474425 A | 2/2004 |
| CN | 101582530 A | 11/2009 |

(Continued)

OTHER PUBLICATIONS

Sonderegger., "Vacuum Sealing Technology", CERN Accelerator School, Platja D'Aro, pp. 1-52, 16-24, May 2006.

(Continued)

*Primary Examiner* — Louis Arana
(74) *Attorney, Agent, or Firm* — Melissa K. Dobson

(57) ABSTRACT

A vacuum feed-through assembly and a method for manufacturing the same including a conductor having a threaded outer diameter end, a plastic seal having a threaded inner diameter matching the threaded outer diameter end of the conductor, and an epoxy to epoxy bond the threaded inner diameter of the plastic seal to the threaded outer diameter end of the conductor.

18 Claims, 4 Drawing Sheets

(56) References Cited

U.S. PATENT DOCUMENTS

2010/0178135 A1    7/2010  Laceky et al.

FOREIGN PATENT DOCUMENTS

| CN | 101882724 A | 11/2010 |
| CN | 202363706 U | 8/2012 |
| EP | 2458692 A1 | 5/2012 |
| GB | 616169 A | 1/1949 |
| GB | 2468756 A | 9/2010 |
| WO | 2011116561 A1 | 9/2011 |

OTHER PUBLICATIONS

Unofficial English Translation of Chinese Office Action issued in connection with corresponding CN Application No. 201310685049.0 on Jul. 2, 2015.

Unofficial English Translation of Chinese Office Action issued in connection with corresponding CN Application No. 201310685049.0 on Feb. 29, 2016.

\* cited by examiner

VACUUM FEED-THROUGH ASSEMBLY

BACKGROUND

Vacuum feed-through assemblies are used in any system or application that requires the transfer of power or current through in a vacuum environment. Present state of the art vacuum feed-through assemblies are based on brazing one end of a stainless steel tube or bellows to the outer diameter of a ceramic ring, which is brazed to the outer diameter of a copper rod. The brazing operations required to join these components together to make a vacuum tight joint are complex, time-consuming, and expensive. Further, the ceramic ring is very brittle and when the joint is subjected to shock or vibration loads, the ceramic often fractures or the joint fails.

It is expensive and time-consuming to perform brazing in ovens and the ceramic is expensive. Sometimes, especially when used in assemblies with cold temperatures, when there are movements and sideways loads, the ceramic breaks and a failure occurs. A failure is significant because the vacuum is lost. The problem of cracking and leaking that occurs when using ceramic seal is unacceptable.

BRIEF DESCRIPTION

A vacuum feed-through assembly and a method for manufacturing the same including a conductor having a threaded outer diameter end, a plastic seal having a threaded inner diameter matching the threaded outer diameter end of the conductor where the matching threads are bonded with epoxy.

DRAWINGS

These and other features and aspects of embodiments of the present invention will become better understood when the following detailed description is read with reference to the accompanying drawings in which like characters represent like parts throughout the drawings, wherein.

DETAILED DESCRIPTION

Embodiments disclosed herein provide a vacuum feed-through assembly and a method of manufacturing the same. According to embodiments of the invention, the vacuum feed-through assembly includes a corrugated bellows threaded in the inner diameter at one end and epoxy bonded to the threaded outer diameter of a plastic or epoxy-glass composite ring or seal, which is threaded at the inner diameter and epoxy bonded to a threaded conductor. The corrugated bellows is optional. A tube or housing without the corrugated bellows may be used. The conductor can be copper or any suitable conductor material. Embodiments of the invention provide a low cost vacuum feed-through assembly which enables transfer of high electrical currents from ambient pressure to high vacuum through a robust, strong joint that can withstand shock and vibration loads without failures or leaks. As mentioned, the vacuum feed-through assembly may be flexible or rigid. Embodiments of the vacuum feed-through assembly provide for supply of current, including a high current ranging from as much as 500 Amps and more, in a vacuum environment.

Unless defined otherwise, technical and scientific terms used herein have the same meaning as is commonly understood by one of ordinary skill. The terms "first", "second", and the like, as used herein do not denote any order, quantity, or importance, but rather are used to distinguish one element from another. Also, the terms "a" and "an" do not denote a limitation of quantity, but rather denote the presence of at least one of the referenced items, and terms such as "front", "back", "bottom", "top", and/or "end" unless otherwise noted, are merely used for convenience of description, and are not limited to any one position or spatial orientation. Moreover, the terms "coupled" and "connected" are not intended to distinguish between a direct or indirect coupling/connection between two components. Rather, such components may be directly or indirectly coupled/connected unless otherwise indicated.

Figure 1A:
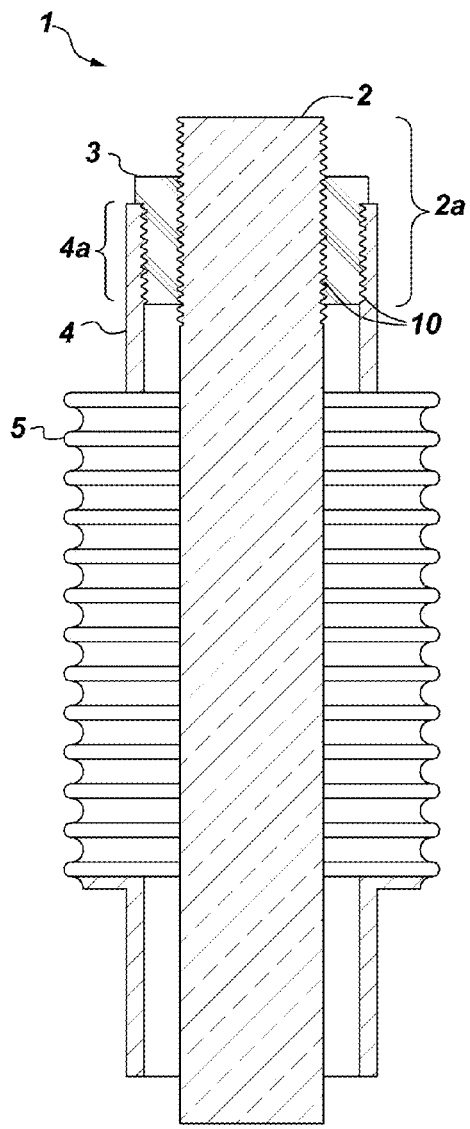
FIGS. 1A-1D illustrate a diagram of a vacuum feed-through assembly according to an embodiment.

Referring to FIGS. 1A-1D, diagrams of a vacuum feed-through assembly according to an embodiment of the invention are shown. As shown in FIG. 1A, the vacuum feed-through assembly 1 includes a conductor 2, a plastic seal 3, and a housing 4. The conductor 2, plastic seal 3 and housing 4 can have any suitable shape. In the exemplary embodiment shown, the conductor 2, plastic seal 3, and the housing 4 are cylinders. The housing 4 houses the conductor 2 and the plastic seal 3. The conductor 2 can be copper or any suitably conducting material. The plastic seal 3 can be plastic, such as G10, an epoxy-glass composite, or reinforced plastic such as ceramic reinforced plastic, for example. In embodiments disclosed herein, the housing 4 is stainless steel and includes a corrugated stainless steel bellows 5. However, the housing 4 can also be rigid and made of other suitable material.

Figure 1B:
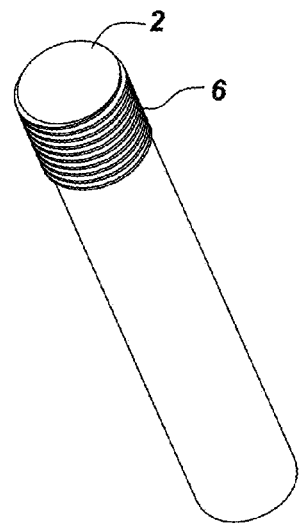
Figure 1C:
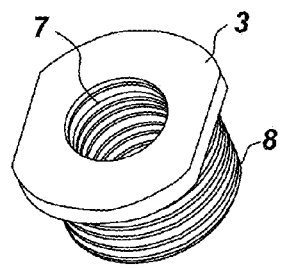
Figure 1D:
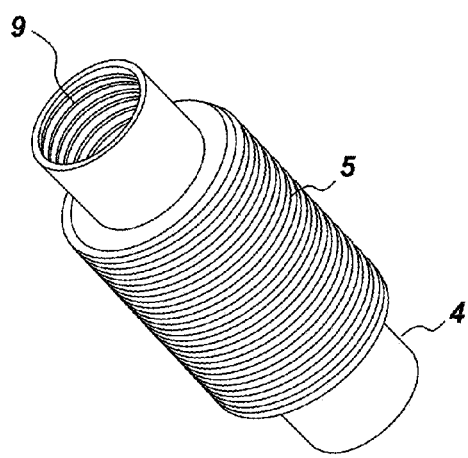

The outer diameter of an end 2a of the conductor 2 includes threads 6 to form a threaded end of the conductor 2, as shown in FIG. 1B. Referring to FIG. 1C, the plastic seal 3 includes a threaded inner diameter 7 that is threaded to match the threads 6 of the threaded outer diameter end 2a of the conductor 2. The outer diameter of the plastic seal 3 includes threads 8. The inner diameter of an end 4a of the housing 4 includes threads 9, as shown in FIG. 1D. The threads 8 of the outer diameter of the plastic seal 3 match the threads 9 of the inner diameter of the housing 4. The threaded assembly is epoxy bonded to create epoxied threads 10, shown in FIG. 1A.

According to embodiments disclosed herein, the plastic seal is strong and protects the vacuum feed-through assembly from any cracks or structural failures. In addition, the plastic seal has some flexibility so it can withstand the shocks, vibrations and loads without breaking. In addition, the plastic seal is much more cost effective than the ceramic seal of conventional assemblies. Embodiments of the invention improve the state of the art by providing a low-cost, strong and failure resistant seal and vacuum feed-through assembly. According to embodiments disclosed herein, the housing 4, with or without the bellows 5, is threaded, the conductor 2 is threaded, and the plastic seal 3 is threaded and the threads are epoxied to form the assembly. Epoxy is placed on threads 6, 7, 8, and 9 and the threads are engaged and cured to form the vacuum feed-through assembly 1. Most epoxies can be cured at ambient temperature and in a reasonable amount of time. The vacuum feed-through according to embodiments of the present invention can be applied in any application or device where a current is transferred through a vacuum interface and/or a very cold interface.

Figure 2:
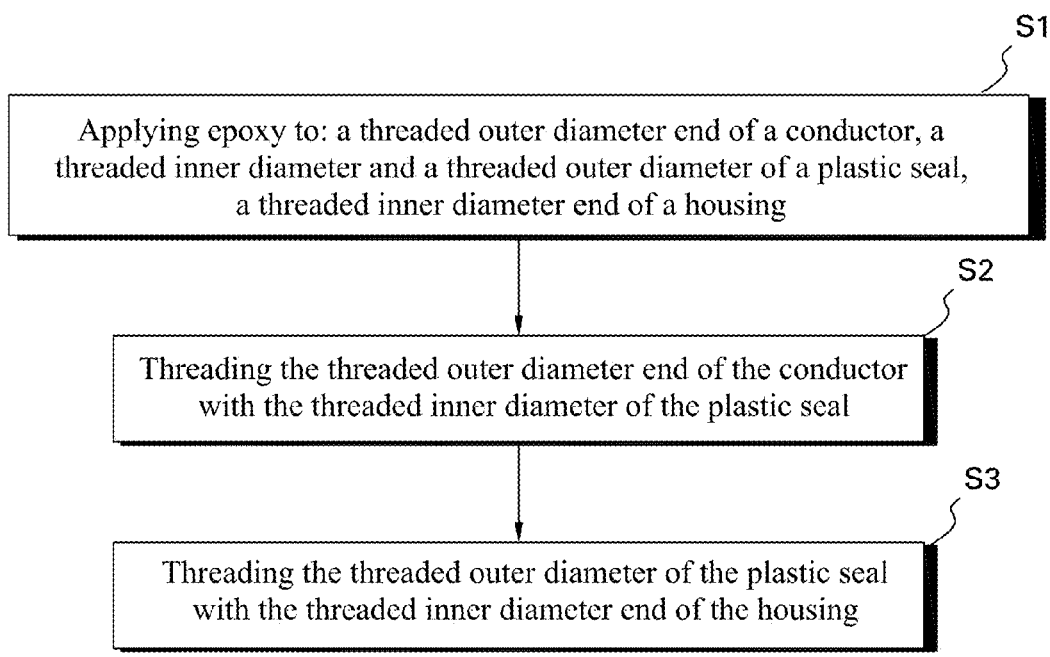
FIG. 2 is a flowchart illustrating a method of manufacturing a vacuum feed-through assembly according to an embodiment of the invention.

FIG. 2 is a flowchart illustrating an exemplary process of manufacturing the vacuum feed-through assembly. In step S1, epoxy is applied to the threaded outer diameter end 2a of the conductor 2, to the threaded inner diameter 7 of the plastic seal 3 and the threaded outer diameter 8 of the plastic seal 3, and to the threaded inner diameter end 4a of the housing. In step S2, the threaded outer diameter end 2a of the conductor 2 is threaded with the threaded inner diameter 7 of the plastic seal 3. In step S3, the threaded outer diameter 8 of the plastic seal 3 is threaded with the threaded inner diameter end 4a of the housing 4.

Figure 3:
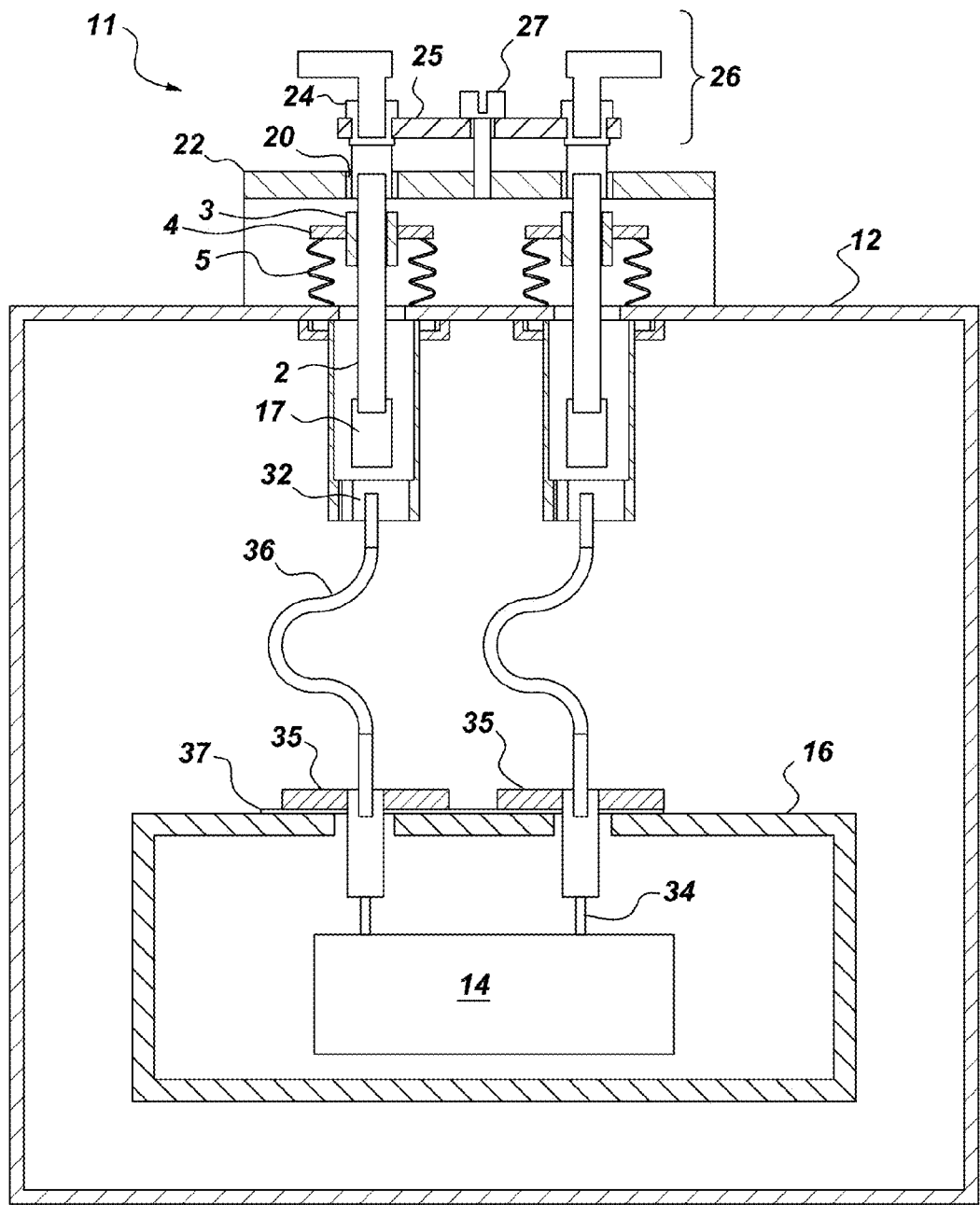
FIG. 3 is a diagram of a current lead assembly for a superconducting magnet according to an embodiment.

FIG. 3 is a diagram of an embodiment of the vacuum feed-through assembly 1 in a current lead assembly for a superconducting magnet according to an embodiment of the invention. Although the current lead assembly includes two retractable current leads for operation, only one side of the retractable current lead assembly will be described for ease of explanation. A vacuum chamber 12 houses a superconducting magnet 14, a thermal shield 16 cooled by a cryocooler (not shown), and a current lead assembly 11. The superconducting magnet 14 is usually cooled to a temperature of about 4K, while the thermal shield is usually cooled to a temperature of about 50K. However, embodiments are not limited to these exemplary temperatures and other temperatures are contemplated.

The current lead assembly 11 includes a retractable current lead or conductor 2 that extends into the vacuum chamber 12 via a through-hole 20 in the vacuum chamber 12. The retractable current lead 18 is secured to a cap 22 by a fastener 24. The retractable current lead 2 includes a retractable contact 17. An actuator assembly 26 is provided to retractably engage and disengage the retractable contact. The retractable current lead 2 and retractable contact 17 can be formed as one part (as shown) or separated into multiple parts such as an actuation rod and a contact portion. The actuator assembly 26 can be arranged according to various techniques to enable the retractable current lead 2 to retractably extend into the vacuum chamber 12. In the embodiment shown in FIG. 3, the actuator assembly 26 includes a support rod 25 coupled to the fastener 24 and a screw 27. The screw 27 enables the retractable current lead 2 to engage and disengage the retractable contact 17. A vacuum feed-through assembly 1 includes the retractable current lead 2, plastic seal 3, and bellows 5.

The current lead assembly 11 also includes a current contact 32 arranged within the vacuum chamber 12. The current contact 32 is coupled to a magnet lead 34 via a thermal connector 36. Thermal stations 35 that receive the thermal connector 36 are secured (e.g., bolted) to the thermal shield 16 through an electrical insulation layer 37. The electrical insulation layer 37 has high thermal conductance so that the temperature of the thermal stations is close to that of the thermal shield 16. Examples of materials for the electrical insulation layer 37 include Kapton with vacuum grease, or filled epoxy with glass. Other suitable materials can be used. The current contact 32 is supported within the vacuum chamber 12 by a thermal isolation support structure 38. The thermal isolation support structure 38 is made of a material that provides thermal isolation while being strong enough to support the current contact 32 and enable high load at connection. Examples of such materials include fiberglass with an epoxy, a plastic insulator such as G10, or other suitable materials. The thermal isolation support structure 38 provides thermal insulation of the current contact 32 from the ambient temperature when the retractable contact 17 is retracted, so that current contact 32 is nearly at the same temperature as the thermal shield 16. Therefore, when the contact or connection between the retractable current lead 2 and the current contact 32 is open, the current contact 32, thermal connector 36, and thermal shield 16, are all maintained at about 50K, thermally insulated from the vacuum vessel at ambient temperature.

The thermal connector 36 is selected to minimize the heat load to the superconducting magnet 14 that results from the connection of the retractable contact 17 with the current contact 32 to power the magnet, even with supply currents of 500 Amps-1000 Amps and more. More particularly, the characteristics of the thermal connector 36 such as material, length, diameter, area, ratio of area to length, for example, are selected to minimize heat conduction. The thermal connector 36 may be a copper or brass cable or wire, for example, and may be rigid or flexible. The thermal connector 36 enables connection to the power supply at ambient temperature with minimal heat load or transfer to the low temperature or superconducting temperature of the superconducting magnet 14.

Superconducting magnets benefit from higher currents because larger superconductor wires are more cost effective in labor and material than smaller wires to fabricate superconducting coils. More particularly, the unit cost of larger wire per ampere meter used for higher current is lower than the smaller wire, which is typically used for lower current such as 100-200 Amps. In addition, fewer turns are required to wind the coil of the magnet. To date, these higher currents are supplied in superconducting magnets that are in a helium vapor or bath environment and not in a vacuum environment. The embodiments disclosed herein enable use of high currents in a vacuum environment for a superconducting magnet by minimizing the heat load to the magnet.

In addition, current lead assemblies in state of the art conduction cooled superconducting magnets make contact at low temperature. Contact at low temperature, such as 50° K and below, results in high resistance and high heat load because good contact is difficult to achieve since the contacts are very cold, rigid, contaminated, and have little compliance which makes it difficult to establish electrical contact. In the embodiments disclosed herein, electrical contact of the magnet to a power supply is made at ambient temperature so that by applying pressure at the contact point a very good electrical contact is established with clean contacts, and very low contact resistance.

More specifically, the thermal isolation provided by the thermal isolation support structure 38 enables the current contact 32 to be maintained either at low temperature, about 50K, when the current lead 2 is retracted, or at ambient temperature when the current contact 17 of the current lead 2 is engaged with contact 32. In addition, the thermal isolation support structure 38 is strong enough to facilitate a high load applied to the contact area. When the retractable current lead 2 is disengaged from the current contact 32, the current contact 32 is cold since it is connected to the magnet 14 via the thermal connector 36 and the magnet lead 34. However, each time contact is established between the retractable current lead 2 and the current contact 32, the current contact 32 warms up to ambient temperature where a good electrical connection occurs and starts conducting heat and electricity. At ambient temperature, any contamination that may have formed as a result of frozen outgassing materials on the current contact 32 disappears as the current contact 32 warms up on contact with the retractable current lead 2. The thermal isolation support structure 38 substantially eliminates any heat load from going into the cryogenic area 15 within the vacuum chamber 12. When contact between the retractable current lead 2 and the current contact 32 is broken, the position of the current contact 32 is maintained by the thermal isolation support structure 38 and the current contact 32 cools down to a cold temperature again. This arrangement enables the retractable current lead 2 and the current contact 32 to be engaged and disengaged without affecting their properties because the contacts occur at ambient temperature.

Figure 4:
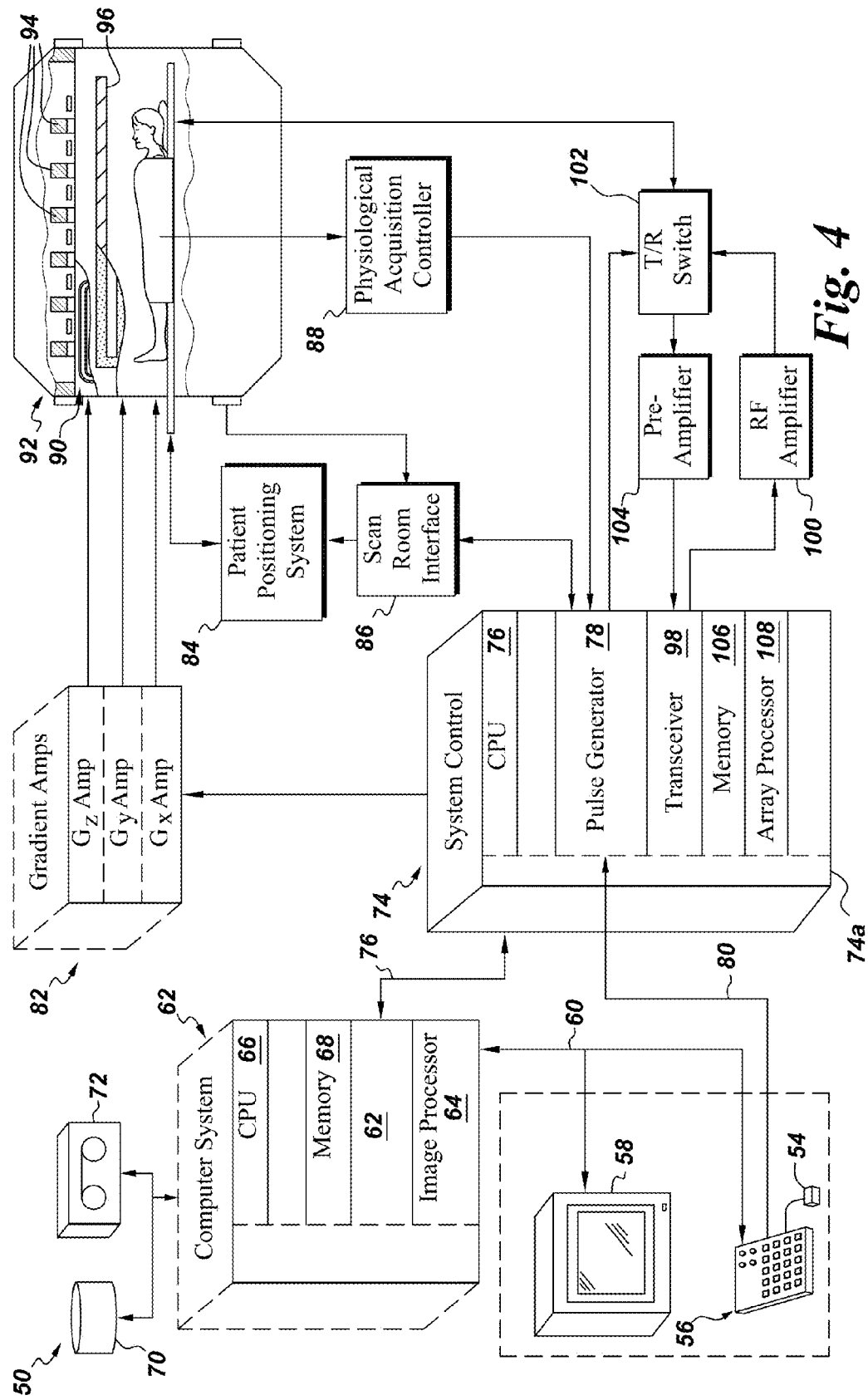
FIG. 4 is a block diagram of an imaging system having a superconducting magnet including the current lead assembly of FIGS. 1 and 3 according to an embodiment of the invention.

Referring to FIG. 4, a magnetic resonance imaging (MRI) system is shown incorporating the vacuum feed-through assembly according to embodiments of the invention. MRI systems typically use superconducting magnets, often with multiple coils to generate the uniform magnetic field. Exemplary superconducting magnet systems operating in MRI systems require occasional ramping of the superconducting magnet to charge the magnet for use of the MRI system. After the superconducting magnet is ramped, the current supply used for the magnet ramping is disconnected and is not needed until further magnet ramping is necessary, such as for demagnetization of the superconducting magnet or for remagnetization of the superconducting magnet after, for instance, scheduled service, a magnet quench, and the like.

The operation of the MRI system 50, shown in FIG. 2, is controlled from an operator console 52 which includes a keyboard or other input device 54, a control panel 56, and a display screen 58. The console 52 communicates through a link 60 with a separate computer system 62 that enables an operator to control the production and display of images on the display screen 58. The computer system 62 includes a number of modules which communicate with each other through a backplane 62a. These include an image processor module 64, a CPU module 66 and a memory module 68, known in the art as a frame buffer for storing image data arrays. The computer system 62 is linked to disk storage 70 and removable storage 72 for storage of image data and programs, and communicates with a separate system control 74 through a high speed serial link 76. The input device 54 can include a mouse, joystick, keyboard, track ball, touch activated screen, light wand, voice control, or any similar or equivalent input device, and may be used for interactive geometry prescription.

The system control 74 includes a set of modules connected together by a backplane 74a. These include a CPU module 76 and a pulse generator module 78 which connects to the operator console 52 through a serial link 80. It is through link 80 that the system control 74 receives commands from the operator to indicate the scan sequence that is to be performed. The pulse generator module 78 operates the system components to carry out the desired scan sequence and produces data which indicates the timing, strength and shape of the RF pulses produced, and the timing and length of the data acquisition window. The pulse generator module 78 connects to a set of gradient amplifiers 82, to indicate the timing and shape of the gradient pulses that are produced during the scan. The pulse generator module 78 can also receive patient data from a physiological acquisition controller 84 that receives signals from a number of different sensors connected to the patient, such as ECG signals from electrodes attached to the patient. And finally, the pulse generator module 78 connects to a scan room interface circuit 86 which receives signals from various sensors associated with the condition of the patient and the magnet system. It is also through the scan room interface circuit 86 that a patient positioning system 88 receives commands to move the patient to the desired position for the scan.

The gradient waveforms produced by the pulse generator module 78 are applied to the gradient amplifier system 82 having Gx, Gy, and Gz amplifiers. Each gradient amplifier excites a corresponding physical gradient coil in a gradient coil assembly generally designated 90 to produce the magnetic field gradients used for spatially encoding acquired signals. The gradient coil assembly 90 forms part of a magnet assembly 92 which includes a polarizing magnet 94 and a whole-body RF coil 96. A transceiver module 98 in the system control 74 produces pulses which are amplified by an RF amplifier 100 and coupled to the RF coil 96 by a transmit/receive switch 102. The resulting signals emitted by the excited nuclei in the patient may be sensed by the same RF coil 96 and coupled through the transmit/receive switch 102 to a preamplifier 104. The amplified MR signals are demodulated, filtered, and digitized in the receiver section of the transceiver 98. The transmit/receive switch 102 is controlled by a signal from the pulse generator module 78 to electrically connect the RF amplifier 100 to the coil 96 during the transmit mode and to connect the preamplifier 104 to the coil 96 during the receive mode. The transmit/receive switch 102 can also enable a separate RF coil (for example, a surface coil) to be used in either the transmit or receive mode.

The MR signals picked up by the RF coil 96 are digitized by the transceiver module 98 and transferred to a memory module 106 in the system control 74. A scan is complete when an array of raw k-space data has been acquired in the memory module 106. This raw k-space data is rearranged into separate k-space data arrays for each image to be reconstructed, and each of these is input to an array processor 108 which operates to Fourier transform the data into an array of image data. This image data is conveyed through the serial link 76 to the computer system 62 where it is stored in memory, such as disk storage 70. In response to commands received from the operator console 52, this image data may be archived in long term storage, such as on the removable storage 72, or it may be further processed by the image processor 64f and conveyed to the operator console 52 and presented on the display 58.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A vacuum feed-through assembly, comprising:
   a retractable conductor having a threaded outer diameter end;
   a plastic seal having a threaded inner diameter matching the threaded outer diameter end of the conductor; and
   epoxy to epoxy bond the threaded inner diameter of the plastic seal to the threaded outer diameter end of the conductor.

2. The vacuum feed-through assembly of claim 1, further comprising:
   a housing having a threaded inner diameter end; and
   wherein the plastic seal further comprises a threaded outer diameter matching the threaded inner diameter end of the housing, and the housing houses the plastic seal and the conductor.

3. The vacuum feed-through assembly of claim 2, wherein the threaded outer diameter of the plastic seal is epoxy bonded to the threaded inner diameter of the housing.

4. The vacuum feed-through assembly of claim 3, wherein the housing further comprises bellows.

5. The vacuum feed-through assembly of claim 4, wherein the bellows comprise stainless steel bellows.

6. The vacuum feed-through assembly of claim 4, wherein the housing and the bellows comprise stainless steel.

7. The vacuum feed-through assembly of claim 1, wherein the plastic seal comprises glass reinforced plastic.

8. The vacuum feed-through assembly of claim 1, wherein the epoxy comprises ceramic filled epoxy.

9. The vacuum feed-through assembly of claim 1, wherein the conductor comprises copper.

10. The vacuum feed-through assembly of claim 1, wherein the conductor comprises one of a flexible conductor and a stiff conductor.

11. A method of manufacturing a vacuum feed-through assembly, comprising:
applying epoxy to a threaded outer diameter end of a conductor, to a threaded inner diameter of a plastic seal and a threaded outer diameter of the plastic seal, and to a threaded inner diameter end of a housing;
threading the threaded outer diameter end of the conductor with the threaded inner diameter of the plastic seal, wherein the conductor is retractable when disengaged from a current contact; and
threading the threaded outer diameter of the plastic seal with the threaded inner diameter end of the housing.

12. The method of claim 11, wherein the housing comprises bellows.

13. The method of claim 11, further comprising:
threading an outer diameter of an end of the conductor to form the threaded outer diameter end;
threading an inner diameter of an end of the housing to form the threaded inner diameter end;
threading an inner diameter of the plastic seal to match the threading of the outer diameter end of the conductor to form the threaded inner diameter of the plastic seal;
threading an outer diameter of the plastic seal to match the threading of the inner diameter end of the housing to form the threaded outer diameter of the plastic seal.

14. A current lead assembly for a superconducting magnet, comprising:
a vacuum chamber having a through hole;
a superconducting magnet arranged inside of the vacuum chamber and having a magnet lead; and
a vacuum feed-through assembly comprising:
a conductor having a threaded outer diameter end and an end extending through the through hole into the vacuum chamber;
a plastic seal having a threaded inner diameter matching the threaded outer diameter end of the conductor; and
epoxy to epoxy bond the threaded inner diameter of the plastic seal to the threaded outer diameter end of the conductor;
wherein the conductor is retractable when disengaged from a current contact.

15. The current lead assembly of claim 14, wherein the vacuum feed-through further comprises:
a housing having a threaded inner diameter end;
wherein the plastic seal further comprises a threaded outer diameter matching the threaded inner diameter end of the housing; and
wherein the housing houses the plastic seal and the conductor.

16. The current lead assembly of claim 15, wherein the threaded outer diameter of the plastic seal is epoxy bonded to the threaded inner diameter of the housing.

17. The current lead assembly of claim 15, wherein the housing further comprises bellows.

18. A magnetic resonance imaging (MRI) system, comprising:
a vacuum chamber enclosing a vacuum space and comprising a through-hole;
a superconducting magnet arranged inside of the vacuum chamber and having a magnet lead; and
a vacuum feed-through assembly comprising:
a conductor having a threaded outer diameter end and an end extending through the through hole into the vacuum chamber;
a plastic seal having a threaded inner diameter matching the threaded outer diameter end of the conductor; and
epoxy to epoxy bond the threaded inner diameter of the plastic seal to the threaded outer diameter end of the conductor;
wherein the conductor is retractable, allowing the conductor to retract when disengaged from a current contact.

* * * * *